United States Patent
La Placa et al.

(10) Patent No.: US 7,586,331 B2
(45) Date of Patent: Sep. 8, 2009

(54) SELF-ADAPTIVE OUTPUT BUFFER BASED ON CHARGE SHARING

(76) Inventors: Michele La Placa, Via Filippo Juvara, 1, I-90015 Cefalu' (PA) (IT); Ignazio Martines, Via Mario Rapisardi, 9b, I-95030 Tremestieri Etneo (CT) (IT)

(*) Notice: Subject to any disclaimer, the term of this patent is extended or adjusted under 35 U.S.C. 154(b) by 133 days.

(21) Appl. No.: 11/482,524

(22) Filed: Jul. 7, 2006

(65) Prior Publication Data
US 2007/0040562 A1  Feb. 22, 2007

(30) Foreign Application Priority Data
Jul. 7, 2005  (EP) .................................. 05106180

(51) Int. Cl.
- H03K 19/094 (2006.01)
- H03K 17/16 (2006.01)
- H03B 1/00 (2006.01)

(52) U.S. Cl. .................. 326/83; 326/26; 326/27; 326/87; 327/108; 327/109

(58) Field of Classification Search ............ 326/26, 326/27, 82, 83, 86, 87; 327/108, 109
See application file for complete search history.

(56) References Cited

U.S. PATENT DOCUMENTS

| | | | |
|---|---|---|---|
| 6,130,541 A * | 10/2000 | Ozguc | 324/678 |
| 6,239,617 B1 | 5/2001 | Guertin et al. | |
| 6,297,677 B1 | 10/2001 | Ang et al. | |
| 6,480,798 B2 | 11/2002 | Lee | |
| 6,608,507 B2 | 8/2003 | Garrett, Jr. et al. | |
| 2002/0196035 A1 | 12/2002 | Cho | |

FOREIGN PATENT DOCUMENTS

EP  0 735 687 A2  10/1996

OTHER PUBLICATIONS

European Search Report for EP 05 10 6180 dated Dec. 8, 2005.

* cited by examiner

*Primary Examiner*—Thienvu V Tran
(74) *Attorney, Agent, or Firm*—Blakely, Sokoloff, Taylor & Zafman LLP

(57) ABSTRACT

A self-adaptive output buffer for an output terminal of an electronic circuit suitable to be connected to a load is proposed. The self-adaptive output buffer includes means for sensing an indication of the capacitance of the load and means for driving the load according to the sensing, wherein the means for sensing includes capacitive means with a preset capacitance, means for charging the capacitive means to a preset voltage, means for coupling the charged capacitive means with the load, and means for measuring a measuring voltage at the capacitive means due to a charge sharing between the capacitive means and the load.

18 Claims, 5 Drawing Sheets

SELF-ADAPTIVE OUTPUT BUFFER BASED ON CHARGE SHARING

PRIORITY CLAIM

This application claims priority from European patent application No. EP05106180.2, filed Jul. 7, 2005, which is incorporated herein by reference.

TECHNICAL FIELD

The present invention relates to the electronic field. More specifically, the present invention relates to output buffers for electronic circuits.

BACKGROUND

Output buffers are generally used for interfacing electronic circuits (such as semiconductor memory devices) with the external environment, typically a system bus. The output buffers amplify the signals to be provided to the bus; moreover, they supply the power (i.e., the current) required to drive a capacitive load that is generally introduced by the bus.

In certain applications, the output buffers must be able to drive a variable capacitive load. The unexpected variability of the capacitive load may impair the performance of the electronic circuit as a whole.

For example, when the output buffers are adapted to deliver data from a memory device to a bus, the output rate of the data depends on the slew rate of each output buffer. As it is well known, the slew rate is the changing rate of the voltage furnished by the output buffer over time; this parameter depends on the value of the capacitive load and on the value of the current supplied by the output buffer. Thus, when the value of the current is fixed, the actual slew rate is affected by the variable capacitive load and accordingly its value will be different from the desired one; in particular, for high capacitive loads the slew rate will be lower (thereby reducing the output rate). Conversely, for low capacitive loads the slew rate will be higher. However, an output buffer having a slew rate greater than the desired one is often unfavorable since it can generate a large number of high-frequency harmonics. The high-frequency harmonics can give rise to electromagnetic interference that impairs the performance of the electronic circuit as a whole.

Moreover, in order to have an error-free data transfer it is often necessary to reduce the noise sources, such as the switching noise and the IR noise. Both these noise sources are directly dependent on the current supplied to the capacitive load and on the parasitic elements, for example, due to forward and backward cross-talk phenomena.

In order to accommodate variable capacitive loads, a solution could be to supply a fixed current assuming a large capacitive load (so as to ensure the desired output rate in any condition); however, for the above described reasons, this choice increases the contribution of the noise sources to the error in the data transfer when the actual capacitive load is lower. Moreover, this solution is sensitive to the typically unavoidable process spreads.

A known solution to the problem is of providing an output buffer that can be customized for the actual capacitive load through a suitable programming by the users. Even though this solution allows adjusting the slew rate depending on the capacitive load, it has a series of drawbacks. First of all, the proposed solution is not able to adjust the slew rate automatically; moreover, it also assumes the capacitive load is known. In any case, the programming requires a direct intervention of the users (which can be undesirable if not even unacceptable).

The U.S. Pat. No. 6,130,541, which is incorporated by reference, proposes an output buffer with a circuit for sensing the capacitive load and for adjusting the output current accordingly, so as to reach the desired slew rate. In this patent, the sensing of the capacitive load is based on providing a predefined reference current to the capacitive load and then measuring the corresponding voltage slope. A drawback of this solution is that a leakage current of the capacitive load may impair the sensing, causing a slew rate different from the desired one. Indeed, it is often not possible to use a reference current of high value (so as to make negligible the effect of the leakage current), since this might involve a too-high voltage slope that is very difficult to measure.

SUMMARY

According to an embodiment of the present invention, the idea of using charge sharing techniques for sensing the capacitive load is suggested.

Particularly, an embodiment of the present invention proposes a self-adaptive output buffer for an output terminal of an electronic circuit, which is suitable to be connected to a load. The output buffer includes means for sensing an indication of the capacitance of the load and means for driving the load according to the sensing. The means for sensing includes capacitive means with a preset capacitance, means for charging the capacitive means to a preset voltage and means for coupling the charged capacitive means with the load. The means for sensing further includes means for measuring a measuring voltage at the capacitive means due to a charge sharing between the capacitive means and the load.

In an embodiment of the invention, this result is achieved by exploiting the power supply voltage of the output buffer.

A specific circuital implementation for this purpose is also proposed according to an embodiment of the invention.

The capacitance of the load may be measured by comparing the measuring voltage with one or more comparing voltages.

In an embodiment of the invention, the comparison is parallel.

Alternatively, in another embodiment of the invention, the comparison is serial.

As a further improvement, in the latter case the comparing voltages are provided in decreasing value order according to an embodiment of the invention.

The proposed solution may be applied at the power-on of the electronic circuit.

A further embodiment of the present invention provides an electronic circuit including one or more output buffers for its output terminals.

Another embodiment of the present invention provides a corresponding method for operating a self-adaptive output buffer.

BRIEF DESCRIPTION OF THE DRAWINGS

Embodiments of the invention, however, as well as features and the advantages thereof, will be best understood by reference to the following detailed description, given purely by way of a non-restrictive indication, to be read in conjunction with the accompanying drawings.

DETAILED DESCRIPTION

Figure 1:
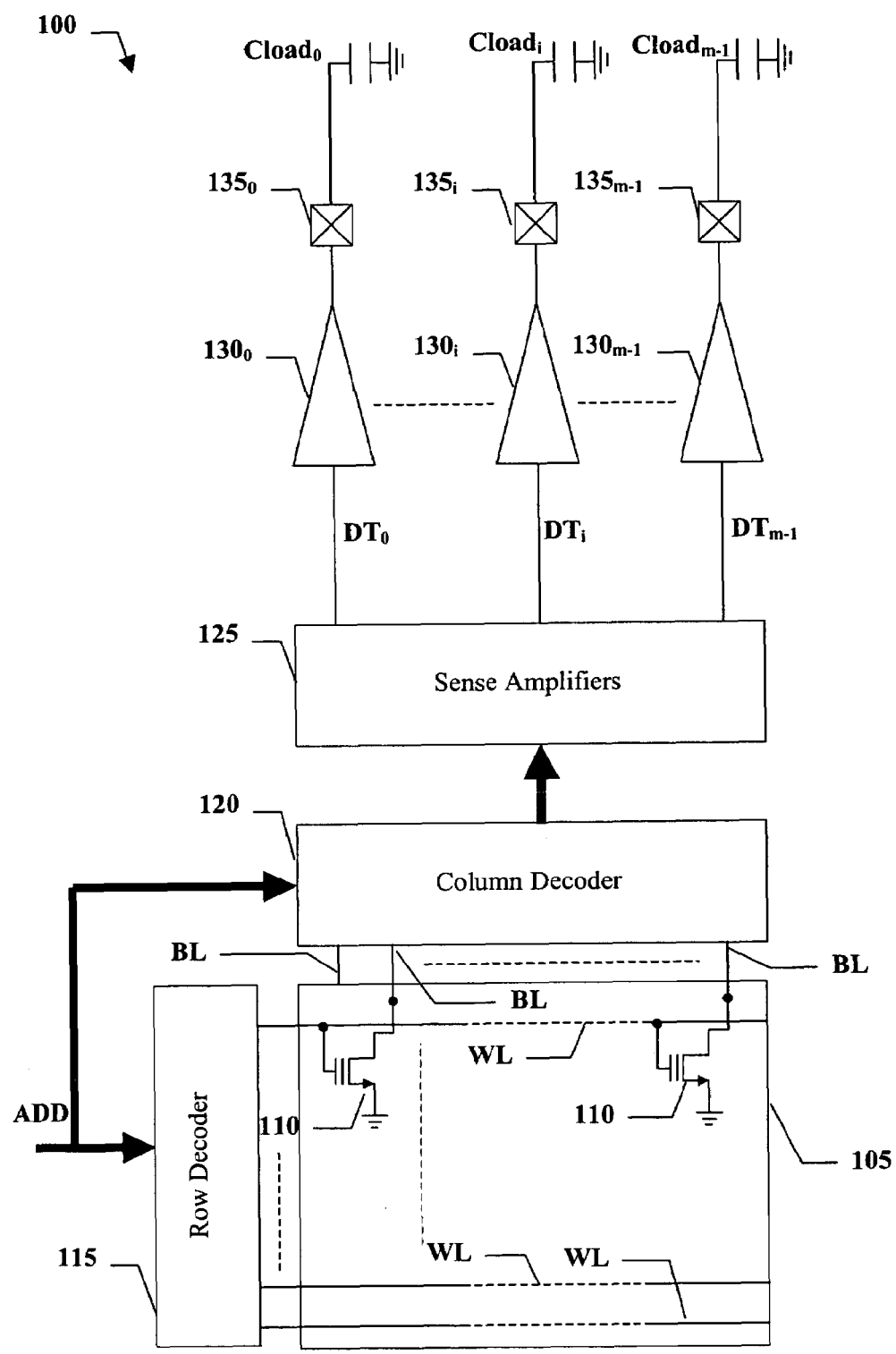
FIG. 1 is a schematic block diagram of a memory device in which a solution according to an embodiment of the invention can be used.

Referring to FIG. 1, a memory device 100 is schematically represented according to an embodiment of the invention. The memory device 100 includes one or more matrices 105 of memory cells 110, for example, consisting of floating gate MOS transistors. The memory cells 110 of each column have the drain terminals connected to a respective bit line BL, while the memory cells 110 of each row have the gate terminals connected to a respective word line WL. The memory device 100 receives an address ADD for accessing selected memory cells 110. A portion of the address ADD is supplied to a row decoder 115, which selects a desired word line WL. Another portion of the address ADD is supplied to a column decoder 120, which selects a set M of desired bit lines BL (for example, m=8).

The column decoder 120 connects the selected bit lines BL to a bank of sense amplifiers 125, which read the data currently stored in the selected memory cells 110 (denoted with DTi, i=0 ... m−1).

The sense amplifiers 125 make available the read data $DT_i$ to corresponding self-adaptive output buffers $130_i$. In turn, the output buffers $130_i$ drive respective pads $135_i$, which are used for connecting the memory device 100 to an external bus for delivering the data $DT_i$; typically, the external bus introduces a substantial capacitive load. This capacitive load is represented by an external capacitor $Cload_i$ (for example, with a capacitance of 50-100 pF), which is connected to each pad $135_i$.

Figure 2:
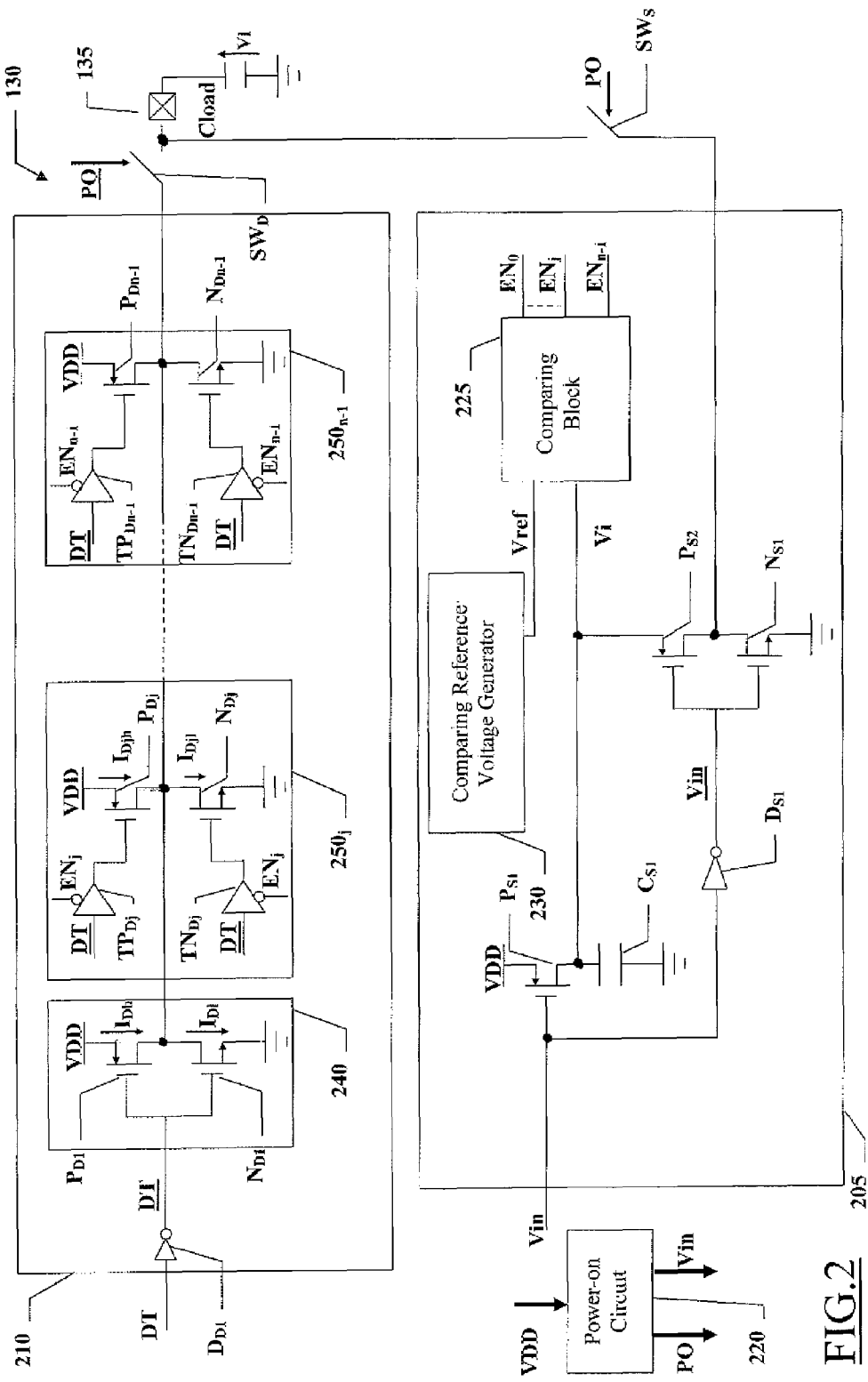
FIG. 2 is an exemplary implementation of a self-adaptive output buffer of the memory device according to an embodiment of the invention.

Referring to FIG. 2, an exemplary implementation of a generic output buffer 130 is shown (from now on, the suffixes "i" will be omitted for the sake of simplicity) according to an embodiment of the invention.

In particular, the output buffer 130 includes a capacitance sensor 205 and a driver 210. Two switches $SW_D$ and $SW_S$ connect the capacitance sensor 205 and the driver 210, respectively, to the external capacitor Cload through the pad 135 (the voltage at the external capacitor Cload is denoted with VI). The switches $SW_S$ and $SW_D$ are driven by a signal PO from a power-on circuit 220 and by a corresponding negated signal $\underline{PO}$, respectively. The block 220 is a circuit adapted to sense a supply voltage VDD (at its input terminal), and to assert the signal PO (at its output terminal) for a predefined time period when it detects that the supply voltage VDD has reached a predetermined level.

The capacitance sensor 205 includes a P-MOS transistor $P_{S1}$ connected in series to an internal capacitor $C_{S1}$. More in detail, the internal capacitor $C_{S1}$ has a first electrode connected to the drain terminal of the transistor $P_{S1}$ and a second electrode connected to a ground terminal providing a reference voltage (or ground). The transistor $P_{S1}$ has the source terminal connected to a supply terminal providing the supply voltage VDD (e.g., 3.3V), and the gate terminal that receives an activation signal Vin; the activation signal Vin is generated by the power-on circuit 220 together with the enabling signal PO. The gate terminal of the transistor $P_{S1}$ is also connected to the input terminal of an inverter $D_{S1}$, which has the output terminal (providing a corresponding negated activation signal $\underline{Vin}$) connected to the gate terminals of a PMOS transistor $P_{S2}$ and of an NMOS transistor $N_{S1}$. The transistor $P_{S2}$ has the source terminal connected to the drain terminal of the transistor $P_{S1}$, and the transistor $N_{S1}$ has the source terminal connected to the ground terminal; both the transistors $P_{S2}$ and $N_{S1}$ have the drain terminals connected to the pad 135 through the switch $SW_S$.

A comparing block 225 is also provided in the capacitance sensor 205. The comparing block 225 has a first input terminal that is connected to a comparing reference voltage generator 230 and a second input terminal that is connected to the drain terminal of the transistor $P_{S1}$. The comparing block 225 receives at its input terminals a comparing voltage Vref from the comparing reference voltage generator 230, and an internal voltage Vi from the internal capacitor $C_{S1}$, and outputs a set of enabling signals $EN_0 \ldots EN_{n-1}$ (for example, n=4-10) which are used for activating a portion of the circuitry of the driver 210 (as described in the following).

The driver 210 includes an inverter $D_{D1}$, a main final stage 240, and an adjusting final stage $250_j$ for each enabling signal $EN_j$ (j=0 ... n−1). The inverter $D_{D1}$ has an input terminal receiving the data DT from the corresponding sense amplifier (not shown in the figure) and an output terminal providing a negated data $\underline{DT}$. The main final stage 240 includes a PMOS transistor $P_{D1}$ and an NMOS transistor $N_{D1}$. More in detail, the transistor $P_{D1}$ has the source terminal connected to the supply terminal and the drain terminal connected to the drain terminal of the transistor $N_{D1}$; the source terminal of the transistor $N_{D1}$ is connected to the ground terminal. Both the transistors $N_{D1}$ and $P_{D1}$ have the gate terminals connected to the output terminal of the inverter $D_{D1}$ for receiving the negated data $\underline{DT}$. Moreover, the drain terminals of the transistors $P_{D1}$ and $N_{D1}$ are connected to the pad 135 through the switch $SW_D$.

The adjusting final stages $250_j$ have a circuit architecture similar to one of the main final stage 240. Particularly, each adjusting final stage $250_j$ includes a PMOS transistor $PD_j$ and an NMOS transistor $ND_j$. The transistor $PD_j$ has the source terminal connected to the supply terminal and the drain terminal connected to the pad 135 through the switch $SW_D$. The gate terminal of the transistor $P_{Dj}$ is connected to an output terminal of a tristate buffer $TP_{Dj}$. The tristate buffer $TP_{Dj}$ has an input terminal receiving the negated data $\underline{DT}$, and an enabling terminal receiving the corresponding enabling signal $EN_j$. The transistor $N_{Dj}$ has the drain terminal connected to the drain terminal of the transistor $P_{Dj}$ and the source terminal connected to the ground terminal. The gate terminal of the transistor $N_{Dj}$ is connected to an output terminal of a tristate buffer $TN_{Dj}$. The tristate buffer $TN_{Dj}$ has an input terminal receiving the negated data $\underline{DT}$, and an enabling terminal receiving the corresponding enabling signal $EN_j$.

At the power-on of the memory device, the control signal PO is brought to a high logic value (VDD) and the negated control signal $\underline{PO}$ is brought to a low logic value (0V); as a result, the switch $SW_S$ is closed and the switch $SW_D$ is opened so as to prevent any interference of the driver 210 with the capacitance sensor 205. At the beginning (i.e., during a phase that will be referred to in the following as first phase), the activation signal Vin is at the low logic value so that the transistor $P_{S1}$ switches on.

Consequently, the internal capacitor $C_{S1}$ is charged to the supply voltage VDD. At the same time, the transistor $N_{S1}$ switches on and the transistor $P_{S2}$ switches off in response to the negated activation signal $\overline{Vin}$ at the high logic value. In such a way, the external capacitor Cload is discharged to ground.

After a predetermined delay (for example, 100 μs) ensuring that the above described operations complete, the activation signal Vin switches from the low logic value to the high logic value. In response thereto, the transistor $P_{S1}$ switches off. At the same time, the transistors $P_{S2}$ switches on and the transistor $N_{S1}$ switches off. In such a way, the external capacitor Cload is connected in parallel to the internal capacitor $C_{S1}$.

The internal capacitor $C_{S1}$ and the external capacitor Cload then reach an equilibrium (or measuring) voltage Vt by charge sharing (this phase will be referred to in the following as second phase).

The measuring voltage Vt depends on the supply voltage VDD and also on the capacitance values of the capacitors $C_{S1}$ and Cload (in the following indicated with the same references of the corresponding circuit elements).

Indeed, when the internal capacitor $C_{S1}$ is charged to the supply voltage VDD, the charge Q1 stored on its plates is:

$$Q_1 = VDD * C_{S1}$$

At the equilibrium condition, the capacitors $C_{S1}$ and Cload store a charge Q2 on their plates given by:

$$Q_2 = C_{S1}Vt + CloadVt = Vt*(Cload + C_{S1})$$

During the charge sharing, the charge is conserved, so that it results:

$$Q_1 = Q_2 \Rightarrow C_{S1}*VDD = Vt*(Cload + C_{S1}) \Rightarrow$$

$$Vt = C_{S1}*VDD/(Cload + C_{S1}).$$

Therefore, by measuring the voltage at the internal capacitor $C_{S1}$ (i.e., the measuring voltage Vt), it is possible to obtain an indication of the external capacitance Cload. In fact we obtain that:

$$Cload = C_{S1}(VDD - Vt)/Vt$$

It should be noted that the measuring voltage Vt is higher for low values of the external capacitance Cload (up to Vt=VDD for Cload≈0) and vice versa the measuring voltage Vt is lower for high values of the external capacitance Cload (down to Vt=0 for Cload≈∞).

Figure 3:
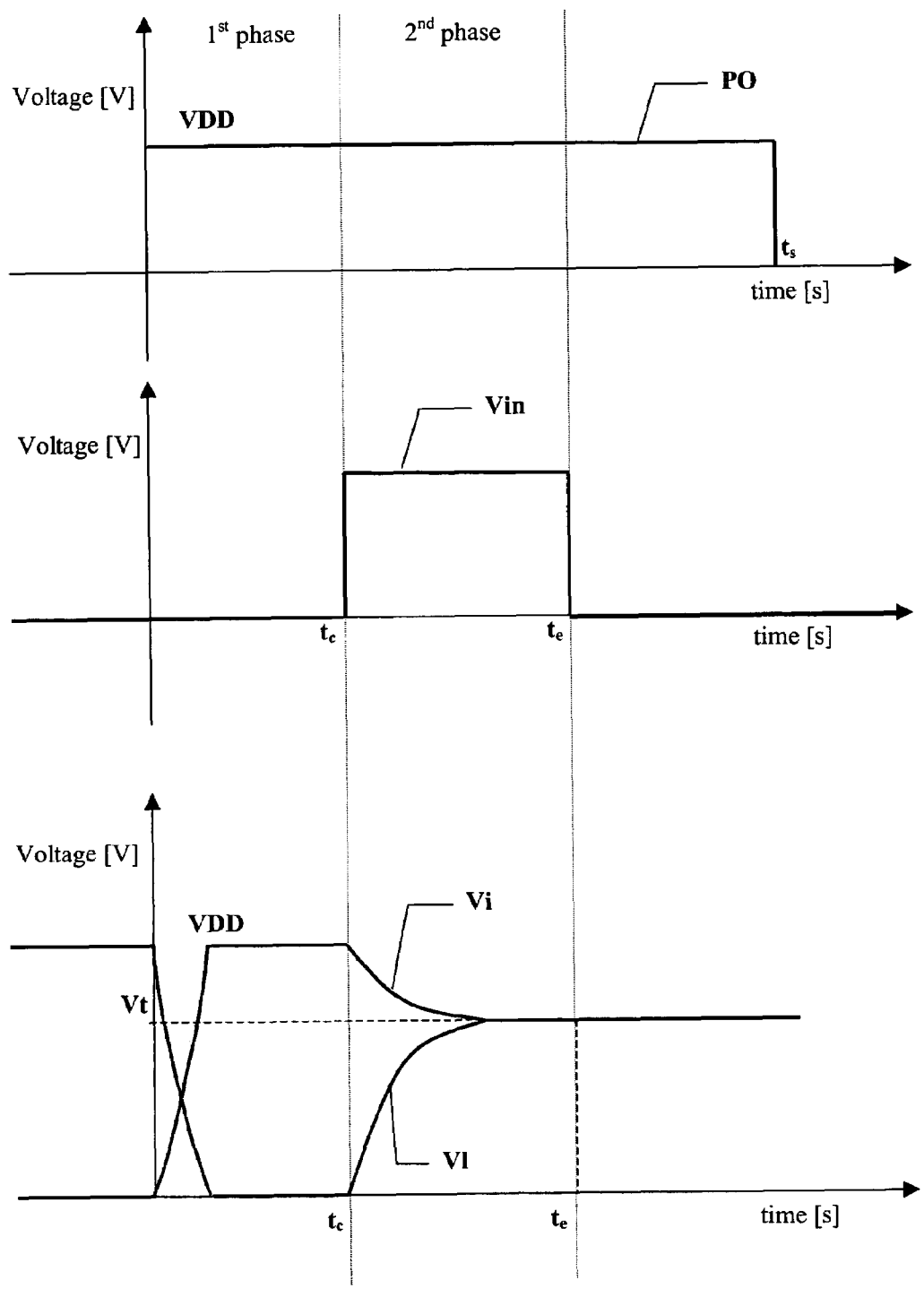
FIG. 3 shows illustrative time diagrams explaining the operation of a capacitance sensor included in this output buffer according to an embodiment of the invention.

Considering now FIGS. 2 and 3 together, the operation of the capacitance sensor 205 is described with reference to the time-diagrams of the voltage at the internal capacitor $C_{S1}$, of the voltage at the external capacitor Cload, of the control signal PO and of the activation signal Vin during the first and the second phase.

The two upper time-diagrams show the control signal PO and the activation signal Vin over time. The lower time-diagram shows the voltages at the capacitors $C_{S1}$ and Cload, i.e. Vi and Vl, respectively.

During the $1^{st}$ phase (i.e., during the time period ranging from 0 to a time tc) the activation signal Vin has the low logic value and the control signal PO has the high logic value. In this phase, after a short transient time the voltage Vi reaches VDD and the voltage Vl reaches 0V. During the $2^{nd}$ phase (i.e., during the time period ranging from the time tc to a time te) the activation signal Vin switches to the high logic value (while the control signal PO remains at the same high logic value). From now on, depending on the charge sharing between the capacitors $C_{S1}$ and Cload, the voltage Vi reduces over time from the maximum value VDD to the measuring voltage Vt. At the same time, the voltage Vl increases from the value 0V to the measuring voltage Vt. The equilibrium condition is so reached in any case before the time te.

The internal voltage Vi (i.e. the measuring voltage Vt) is feed to the comparing block 225 and it is compared with the reference voltages Vref provided by the comparing reference voltage generator 230 (as described in the following). Accordingly, the comparing block 225 outputs the enabling signals $EN_0 \ldots EN_{n-1}$ which represent the value of the measuring voltage Vt (and thus the value of the external capacitance Cload). Particularly, the number of enabling signals $EN_j$ at the high logic value is substantially proportional to the measuring voltage Vt (so that the number of enabling signals $EN_j$ at the low logic value is substantially proportional to the external capacitance Cload). The enabling signal PO has a length (for example, 200-300 μs) enough to ensure the completion of the above-described operations (i.e., from 0 to a time ts). As soon as the control signal PO switches to the low logic value, the switch $SW_S$ is opened and the switch $SW_D$ is closed. The output buffer 130 can then start working normally.

Referring now to FIG. 2, let us assume that the data DT has the high logic value (thus the negated data $\overline{DT}$ has the low logic value). The voltage corresponding to the negated data $\overline{DT}$ is applied to the gate terminals of the transistors $P_{D1}$ and $N_{D1}$ forming the main final stage 240. In such a way, the transistor $P_{D1}$ switches on and the transistor $N_{D1}$ switches off. A main current $I_{Dh}$ from the transistor $P_{D1}$ is injected into the external capacitor Cload (for charging it to the supply voltage). Alternatively, when the data DT has the low logic value (and the negated data $\overline{DT}$ has the high logic value), the corresponding voltage applied to the gate terminals of the transistors $P_{D1}$ and $N_{D1}$ switches off the first one and switches on the latter one so that a current $I_{Dl}$ is sunk from the external capacitor Cload to the transistor $N_{D1}$ (for discharging it to the ground voltage).

When a generic enabling signal $EN_j$ is at the high logic value, the tristate buffers $TP_{Dj}$ and $TN_{Dj}$ keep floating the gate terminals of the transistors $P_{Dj}$ and $N_{Dj}$, respectively (or pull the gate terminals of $PD_j$ and $ND_j$ to VDD and ground, respectively); therefore, the transistors $P_{Dj}$ and $N_{Dj}$ are always switched off. On the contrary, when the enabling signal $EN_j$ is at the low logic value, the tristate buffer $TP_{Dj}$ transfers the negated data $\overline{DT}$ to the gate terminal of the transistor $P_{Dj}$, and the tristate buffer $TN_{Dj}$ transfers the negated data $\overline{DT}$ to the gate terminal of the transistor $N_{Dj}$. Accordingly, an adjusting current $I_{Djh}$ is injected from the transistor $P_{Dj}$ to the external capacitor Cload (when the negated data $\overline{DT}$ is at the low logic value) or an adjusting current $I_{Djl}$ is sunk from the external capacitor Cload to the transistor $N_{Dj}$ (when the negated data $\overline{DT}$ is at the high logic value).

In such a way, the higher the external capacitance Cload is (i.e., a high number of the enabling signals $EN_j$ are at the low logic value) the higher the adjusting currents $I_{Djh}/I_{Djl}$ are. Therefore, depending on the desired slew rate of the output buffer, the total current provided to the external capacitor Cload may be trimmed by the adjusting currents from/to the adjusting final stages. This structure provides a relatively high accuracy; particularly, the result is independent of any leakage current of the external capacitor Cload. For example, it has been found that it is possible to measure a very small external capacitance Cload (e.g., lower than 10 pF) even with a leakage current up to 100 μA.

Figure 4A:
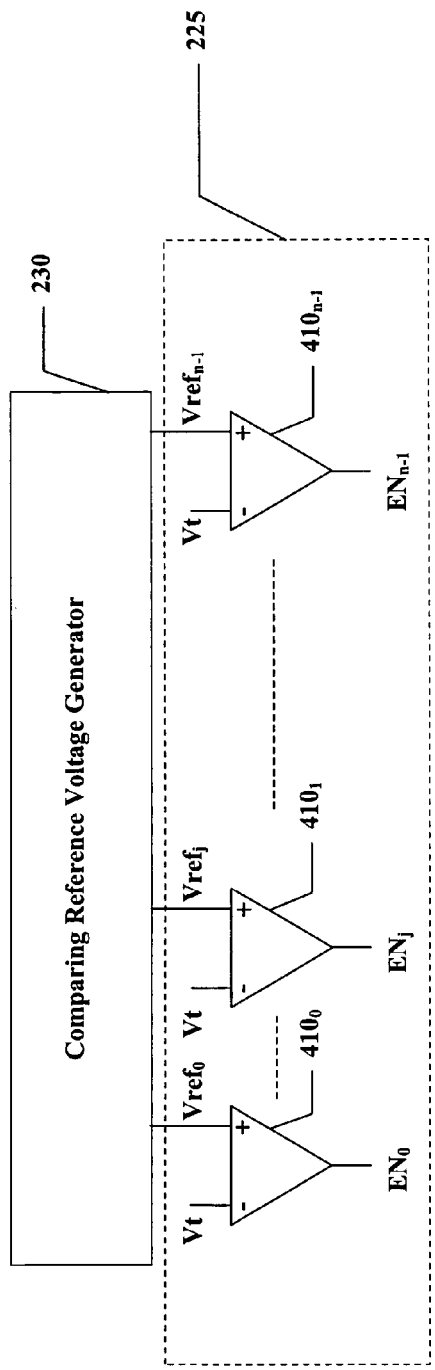
FIG. 4a is an exemplary implementation of a portion of the output buffer according to an embodiment of the present invention.

Referring to FIG. 4a, an exemplary parallel implementation of the comparing block 225 according to an embodiment of the present invention is shown.

In this case, the comparing reference voltage generator 230 outputs a comparing reference voltage $Vref_j$ for each enabling signal $EN_j$, which comparing reference voltages $Vref_j$ ranges the expected values of the measuring voltage Vt (from 0V to VDD). The comparing block 225 includes corresponding comparators 410$_j$. Each comparator 410$_j$ receives the comparing reference voltage $Vref_j$ at a non-inverting input terminal and the measuring voltage Vt at an inverting input terminal, and outputs the enabling signal $EN_j$. When the comparing reference voltage $Vref_j$ is higher than the measuring voltage Vt, the enabling signal $EN_j$ is at the high logic value. Vice versa, when the comparing reference voltage $Vref_j$ is lower than the measuring voltage Vt, the enabling signal $EN_j$ is at the low logic value.

This implementation is typically very fast (at the cost of a relatively large size for the multiple comparators 410$_j$). Moreover it allows reducing the measure errors due to the charging of any parasitic capacitances at the input terminals of the comparators 410$_j$; in fact, the measuring time is typically lower than the time-constant of these parasitic capacitances.

Figure 4B:
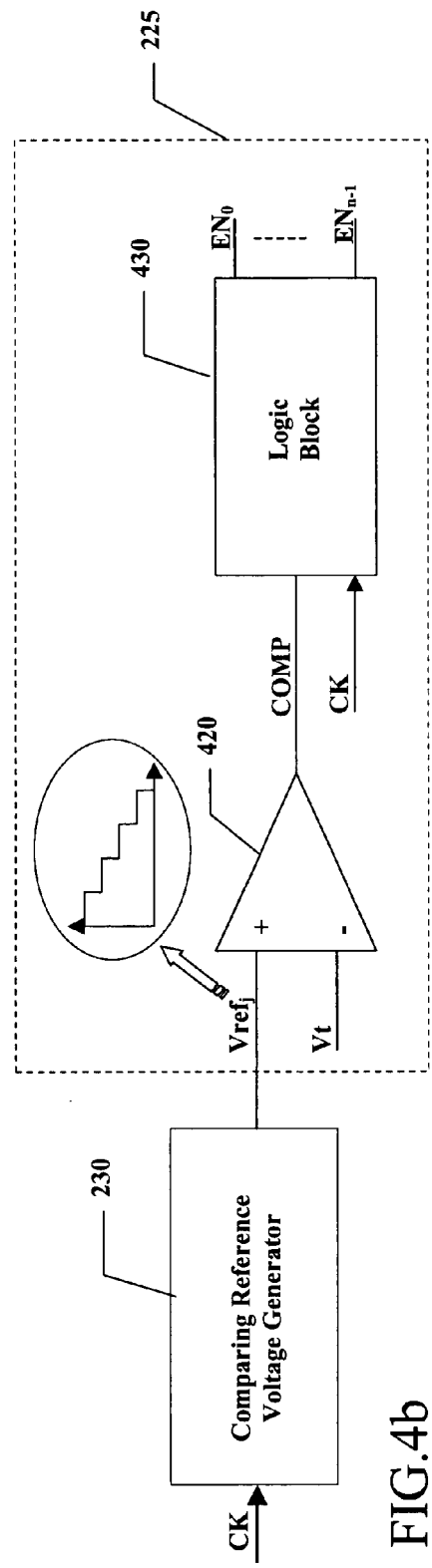
FIG. 4b is a further exemplary implementation of a portion of the self-adaptive buffer according to a different embodiment of the present invention.

Considering now FIG. 4b, an exemplary serial implementation of the comparing block 225 according to a further embodiment of the present invention is shown. In this case, the comparing reference voltage generator 230 outputs the same comparing reference voltages $Vref_j$ in succession (from the highest value to the lowest value in decreasing order) in response to a clock signal CK. The comparing block 225 now includes a single comparator 420. The comparator 420 receives the measuring voltage Vt at an inverting input terminal and the current comparing reference voltage $Vref_j$ at a non-inverting input terminal, and outputs a signal COMP at its output terminal. The comparing block 225 further includes a logic block 430, receiving at its input terminals the signals COMP and CK. The logic block 430 has an output bus that provides the enabling signals $EN_0 \ldots EN_{n-1}$ depending on the signals CK and COMP (with the signal COMP that is also used for latching the enabling signals $EN_0 \ldots EN_{n-1}$). Particularly, until the comparing reference voltage $Vref_j$ is higher than the measuring voltage Vt, the signal COMP is at the high logic level; as soon as the comparing reference voltage $Vref_j$ falls below the measuring voltage Vt, the signal COMP switches to the low logic level. This event is detected by the logic block 430, which outputs the enabling signals $EN_j$ accordingly.

Figure 5:
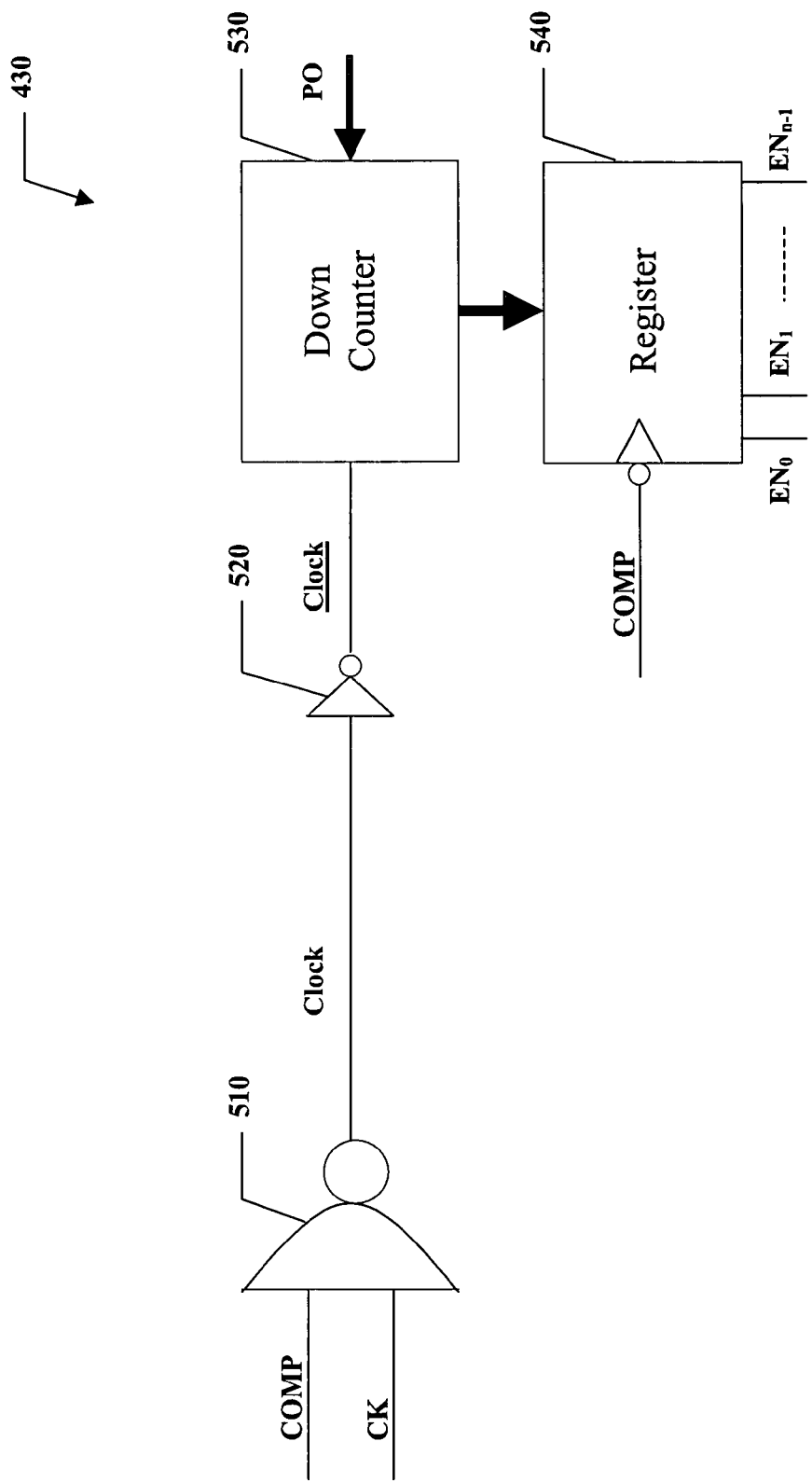
FIG. 5 details a schematic representation of a control block of the output buffer according to an embodiment of the present invention.

An exemplificative schematic block diagram of the logic block 430 is shown in FIG. 5. The logic block 430 includes a NAND gate 510 receiving the signals COMP and CK at its input terminals and outputting a signal Clock for an inverter 520. The inverter 520 supplies the negated signal Clock to a synchronous down counter 530 (with a modulus n−1 equal to the number of enabling signals $EN_j$). The synchronous down counter 530 is reset (to n−1) in response to the switching of the signal PO to the high logic value. The synchronous down counter 530 interfaces with a register 540. Finally, the register 540 is enabled by the signal COMP and outputs the enabling signals $EN_0 \ldots EN_{n-1}$.

Until the signal COMP is at the high logic value (i.e., Vref>Vt), the signal CK propagates (i.e., when the signal CK is at the high logic value also the signal Clock is at the high logic value) to the down counter 530 forcing it to decrease its content (starting from n−1). The down counter 530 stops working when the signal COMP switches to the low logic value (since when the signal COMP is at the low logic value the signal CK cannot propagate and the down counter 530 stops toggling). At the same time, the synchronous down counter 530 outputs its content to the register 540, which in response to the falling edge of the signal COMP stores this value and outputs the enabling signals $EN_0 \ldots EN_{n-1}$, accordingly.

The above described serial implementation is very compact (at the cost of a reduced speed). Nevertheless, it is possible to limit the errors due to the charging of the parasitic capacitances at the input terminals of the comparator by providing the comparing reference voltages $Vref_j$ in fast time succession (so that their charging introduces a negligible voltage variation at the input terminals of the comparator).

Moreover, the choice of providing the comparing reference voltages $Vref_j$ in decreasing order reduces the measuring time when the measuring voltage Vt is higher (and then the external capacitance Cload is lower); therefore, the errors due to the charging of the parasitic capacitances are minimized when they are more dangerous (with respect to the case in which the external capacitance Cload is higher).

Naturally, in order to satisfy local and specific requirements, a person skilled in the art may apply to the solution described above many modifications and alterations. Particularly, although embodiments of the present invention have been described with a certain degree of particularity, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the buffer has a different structure or includes equivalent components.

Embodiments of the invention are also suitable to be implemented in other memory devices such as Dynamic Random Access Memories (DRAM), Static Random Access Memories (SRAM), flash Electrically Erasable Programmable Read Only Memories (EEPROM), either with NOR or NAND architecture, phase-change EEPROMs, multi-level memory devices, and the like.

Embodiments of the invention are also suitable to be implemented by using other means for driving the external capacitor (or any equivalent load). For example, the use of other types of transistors, such as bipolar junction transistors, is within the scope of the invention.

It should be noted that although in the preceding description reference has been made to a buffer having a pair of main transistors that are always enabled this is not a restrictive feature; in fact it is within the scope of the invention the possibility of enabling these transistors by a further enabling signal.

Moreover, it is possible to use different patterns for the comparing reference voltages; in any case, any other technique for inferring the external capacitance from the measuring voltage is contemplated.

Alternatively, it is possible to generate the comparing reference voltages in increasing order (even if it is less advantageous).

Moreover, the output buffer may be set not at every power-on but after a predetermined number of power-on events.

In any case it is possible to have any other number of output buffers in the memory device.

It should be noted that although in the preceding description reference has been made to an output buffer integrated in a memory device, this is not to be intended as a limitation; indeed, such an output buffer in any other electronic circuits (even with discrete electronics components) is possible.

In addition, an integrated circuit (IC) having an output buffer according to an embodiment of the invention may be incorporated in an electronic system such as a computer system.

From the foregoing it will be appreciated that, although specific embodiments of the invention have been described herein for purposes of illustration, various modifications may be made without deviating from the spirit and scope of the invention.

What is claimed is:

1. A self adaptive output buffer for an output terminal of an electronic circuit suitable to be connected to a load, the buffer including:
   means for sensing an indication of the capacitance of the load, wherein the means for sensing includes:
   capacitive means with a preset capacitance;
   means for charging the capacitive means to a preset voltage;
   means for coupling the charged capacitive means with the load; and
   means for measuring a measuring voltage at the capacitive means due to a charge sharing between the capacitive means and the load;
   means for driving the load according to the sensing; and
   means for enabling the means for sensing in response to a power-on of the electronic circuit.

2. An electronic circuit including at least one output terminal and at least one output buffer according to claim 1, each one for a corresponding output terminal.

3. A self adaptive output buffer for an output terminal of an electronic circuit suitable to be connected to a load, the buffer including:
   means for sensing an indication of the capacitance of the load, wherein the means for sensing includes:
   capacitive means with a preset capacitance;
   means for charging the capacitive means to a preset voltage, wherein the means for charging includes means for connecting the capacitive means to a power supply terminal providing a supply voltage and means for connecting the load to a reference terminal providing a reference voltage;
   means for coupling the charged capacitive means with the load, wherein the means for coupling includes means for connecting the capacitive means and the load in parallel; and
   means for measuring a measuring voltage at the capacitive means due to a charge sharing between the capacitive means and the load;
   and wherein the means for sensing includes an inverter, having an input terminal for receiving a control signal and an output terminal, and a first, a second and a third transistor, the first and the second transistors being of a first type and the third transistor being of a second type, and each transistor having a first and a second terminal and a control terminal, wherein the first transistor has the first terminal connected to the supply terminal, the second terminal connected to a first electrode of the capacitive means, and the control terminal connected to the input terminal of the inverter, the capacitive means having a second electrode connected to the reference terminal, wherein the second transistor has the first terminal connected to the second terminal of the first transistor, wherein the third transistor has the first terminal connected to the reference terminal and the second terminal connected to the second terminal of the second transistor, the control terminals of the second and third transistors being connected to the output terminal of the inverter, and wherein the sensing means further includes means for selectively connecting the second terminal of the second transistor to the output terminal, the load being connectable between the output terminal and the reference terminal; and
   means for driving the load according to the sensing.

4. A self-adaptive output buffer for an output terminal of an electronic circuit suitable to be connected to a load, the buffer including:
   means for sensing an indication of the capacitance of the load, wherein the means for sensing includes:
   capacitive means with a preset capacitance;
   means for charging the capacitive means to a preset voltage;
   means for coupling the charged capacitive means with the load; and
   means for measuring a measuring voltage at the capacitive means due to a charge sharing between the capacitive means and the load, wherein the means for measuring includes reference means for providing at least one comparing voltage and comparing means for comparing the measuring voltage with the at least one comparing voltage, wherein the reference means provides a plurality of comparing voltages in parallel, and wherein the comparing means includes a plurality of comparators, each one for comparing the measuring voltage with a corresponding one of the comparing voltages; and
   means for driving the load according to the sensing, wherein the means for driving includes at least one driving transistor for driving the load and means for enabling each driving transistor according to said comparison.

5. A buffer, comprising:
   an input node operable to receive an input signal;
   an output node;
   a driver coupled to the input and output nodes and operable to provide a drive signal to the output node in response to the input signal, wherein the driver comprises multiple drive stages that are each operable to provide a portion of the drive signal to the output node;
   a test component; and
   a sensing circuit coupled to the test component and the output node and operable to
   charge the test component to a predetermined charge level,
   couple the charged test component to the output node,
   measure a test charge level on the test component after coupling the test component to the output node, and
   adjust the drive signal in response to the test charge level, wherein the sensing circuit is operable to adjust the drive signal by enabling a number of the drive stages, the number corresponding to the test charge level.

6. The buffer of claim 5 wherein the drive signal comprises a drive current.

7. The buffer of claim 5, wherein:
   the test component comprises a test capacitor; and
   the sensing circuit is operable to
   charge the test capacitor to a predetermined voltage level,
   couple the charged test capacitor to the output node,
   measure a test voltage level across the test capacitor after coupling the test capacitor to the output node, and
   adjust the drive signal in response to the test voltage level.

8. The buffer of claim 5, wherein:
   the test component comprises a test capacitor having a first node coupled to a reference voltage and having a second node; and
   the sensing circuit is operable to charge the test capacitor to a predetermined voltage level
by coupling the second node of the test capacitor to a
voltage source, couple the second node of the charged test capacitor to
the output node, measure a test voltage level across the first and second
nodes of the test capacitor after coupling the second
node of the test capacitor to the output node, and adjust the drive signal in response to the test voltage
level.

9. The buffer of claim 5 wherein the driver comprises a transistor having a drain coupled to the output node.

10. The buffer of claim 5 wherein the sensing circuit is operable to measure the test charge level on the test component by comparing the test charge level to a reference level.

11. The buffer of claim 5, further comprising:
a supply node operable to receive a supply voltage; and
wherein the sensing circuit is operable to charge the test component, couple the charged test component to the output node, measure a test charge level on the test component, and adjust the drive signal in response to the supply voltage having a predetermined level.

12. A buffer, comprising:
an input node operable to receive an input signal;
an output node;
a driver coupled to the input and output nodes and operable to provide a drive signal to the output node in response to the input signal, wherein the driver comprises multiple drive stages that are each operable to provide a portion of the drive signal to the output node;
a test component; and
a sensing circuit coupled to the test component and the output node and operable to
charge the test component to a predetermined charge level,
couple the test component to the output node after the test component has been charged to the predetermined level,
measure a test charge level on the test component after coupling the test component to the output node, and
adjust the drive signal in response to the test charge level, wherein the sensing circuit is operable to adjust the drive signal by enabling a number of the drive stages, the number corresponding to the test charge level.

13. The buffer of claim 12 wherein the drive signal comprises a drive current.

14. The buffer of claim 12, wherein:
the test component comprises a test capacitor; and
the sensing circuit is operable to
charge the test capacitor to a predetermined voltage level,
couple the charged test capacitor to the output node,
measure a test voltage level across the test capacitor after coupling the test capacitor to the output node, and
adjust the drive signal in response to the test voltage level.

15. The buffer of claim 12, wherein:
the test component comprises a test capacitor having a first node coupled to a reference voltage and having a second node; and
the sensing circuit is operable to
charge the test capacitor to a predetermined voltage level by coupling the second node of the test capacitor to a voltage source,
couple the second node of the charged test capacitor to the output node,
measure a test voltage level across the first and second nodes of the test capacitor after coupling the second node of the test capacitor to the output node, and
adjust the drive signal in response to the test voltage level.

16. The buffer of claim 12 wherein the driver comprises a transistor having a drain coupled to the output node.

17. The buffer of claim 12 wherein the sensing circuit is operable to measure the test charge level on the test component by comparing the test charge level to a reference level.

18. The buffer of claim 12, further comprising:
a supply node operable to receive a supply voltage; and
wherein the sensing circuit is operable to charge the test component, couple the charged test component to the output node, measure a test charge level on the test component, and adjust the drive signal in response to the supply voltage having a predetermined level.

* * * * *